(12) United States Patent
Andersson

(10) Patent No.: US 8,879,435 B1
(45) Date of Patent: Nov. 4, 2014

(54) MEMORY ACCESS SYSTEM AND METHOD

(75) Inventor: Karl G. Andersson, Mission Viejo, CA (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 1741 days.

(21) Appl. No.: 11/018,875

(22) Filed: Dec. 21, 2004

(51) Int. Cl.
  *H04J 3/00* (2006.01)

(52) U.S. Cl.
  USPC ........... 370/280; 370/476; 370/470; 370/472; 370/473; 370/535; 370/536; 370/537; 370/378; 370/300; 370/381; 711/201; 711/211; 711/220; 711/147

(58) Field of Classification Search
  USPC .......... 711/201, 211, 220, 147; 370/378, 381, 370/300, 476, 470, 472, 473, 535–539
  See application file for complete search history.

(56) References Cited

U.S. PATENT DOCUMENTS

| | | | |
|---|---|---|---|
| 6,256,253 B1 * | 7/2001 | Oberlaender et al. | ... 365/230.02 |
| 6,289,428 B1 * | 9/2001 | Derrick et al. | ................ 711/201 |
| 6,789,179 B2 * | 9/2004 | Beat | ............................... 711/201 |
| 7,072,530 B2 * | 7/2006 | Michinaka | .................... 382/306 |
| 7,346,079 B1 * | 3/2008 | Meyer | ........................... 370/476 |
| 2005/0028070 A1 * | 2/2005 | Lin et al. | ...................... 714/779 |

* cited by examiner

*Primary Examiner* — Kibrom T Hailu
(74) *Attorney, Agent, or Firm* — Thomas | Horstemeyer, LLP

(57) ABSTRACT

Various embodiments of systems and methods for memory access are provided. In one embodiment, a data segment is stored in a plurality of memory segments of at least one memory bank. The data segment stored in the memory segments is selected, where the data segment has a bit boundary that is arbitrarily misaligned with at least one memory segment boundary of the memory segments.

21 Claims, 4 Drawing Sheets

MEMORY ACCESS SYSTEM AND METHOD

BACKGROUND

In data communications systems, various devices may be employed for trans-multiplexing applications to facilitate the transport of data between the multitude of devices connected to a network. For example, such devices may be employed in telecommunications networks and in data communications network such as the Internet, wide area network, and the like. There are many different communications standards or channels that may be employed on the various telecommunications and data communications networks in existence. Unfortunately, the various devices that are employed in trans-multiplexing functions within such networks are typically dedicated devices that perform specific trans-multiplexing functions associated with specific communications standards or protocols. As such, these devices are not configurable to be employed in multiple different trans-multiplexing functions.

BRIEF DESCRIPTION OF THE SEVERAL VIEWS OF THE DRAWINGS

The invention can be understood with reference to the following drawings. The components in the drawings are not necessarily to scale. Also, in the drawings, like reference numerals designate corresponding parts throughout the several views.

DETAILED DESCRIPTION

Figure 1:
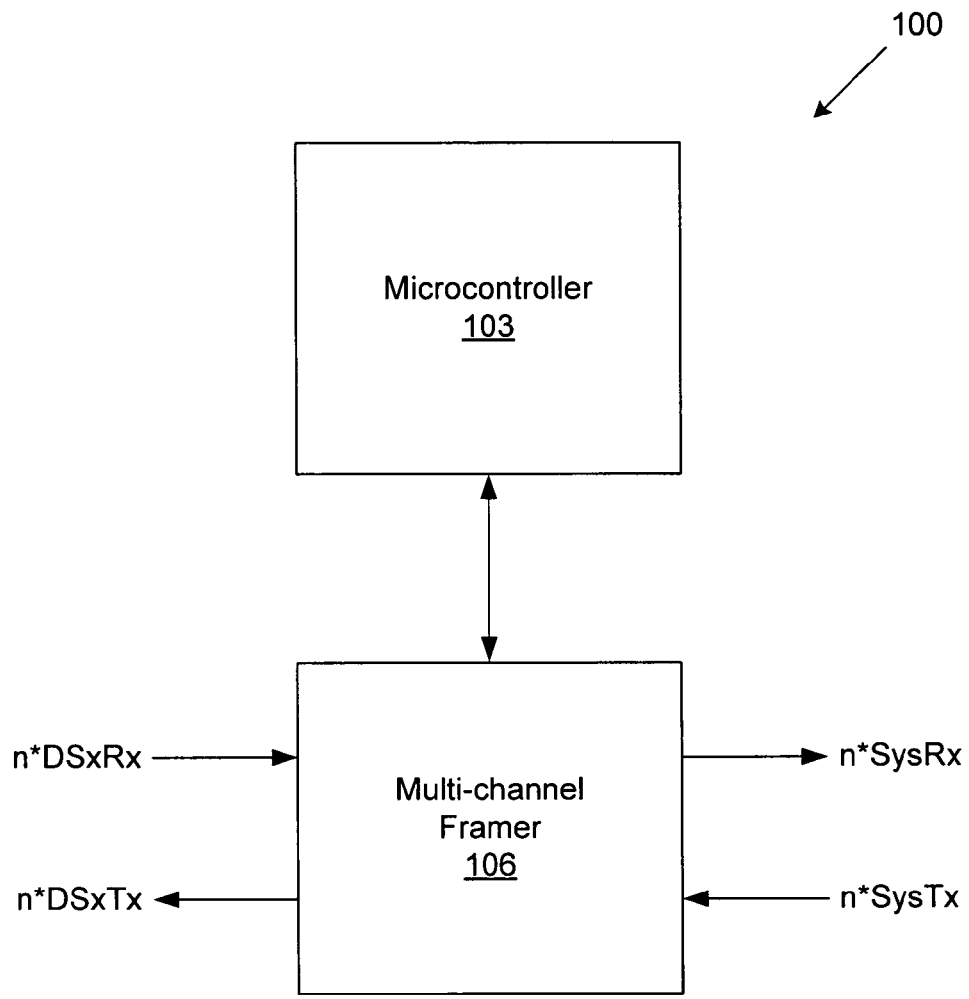
FIG. 1 is a schematic block diagram of one example of a trans-multiplexing data communications device according to an embodiment of the present invention.

Referring to FIG. 1, shown is a trans-multiplexing data communications device 100 according to one example of the present invention. The trans-multiplexing data communications device 100 comprises a microcontroller 103 and a multi-channel framer 106. The trans-multiplexing data communications device 100 may act as a link in a data communications network. The microcontroller 103 controls the operation of the multi-channel framer 106. The multi-channel framer 106 may receive multiple inputs of time domain multiplexed signals, for example, that are processed or combined and are transmitted to other devices within the network according to a different type of a channel protocol.

For example, in some telecommunications or data networks, a DS0 channel is defined as a 64 kilobyte per second channel that may comprise 8 kilobyte per second time slots where the DS0 channel is a time domain multiplexed signal. In a network, many DS0 channels are typically combined into a DS1 channel. Specifically, as is typical, one DS1 channel may incorporate 24 DS0's where the DS1 channel operates at 1.44 megabytes per second. A DS1 channel may also be known as a T1 channel. A DS3 channel typically incorporates 28 DS1 channels and so on. On networks that employ DS3, DS1, DS0, or other channels, data may be communicated in frames or other data structures as payloads associated with each channel. Such data frames or other data structures may comprise headers with various fields, data payload, alignment bits that provide information as to the various types of data within the frame, or other data structure. Also, the data within frames or other data structures may be organized according to a predefined bit pattern. The bit pattern may employ, for example, a bytewise organization or other organization.

The trans-multiplexing data communications device 100 provides a distinct advantage in that the multi-channel framer 106 is configurable to provide for the conversion or trans-multiplexing between multiple diverse types of channels as described above. In addition, other channels beyond those described above may be employed as inputs or outputs of the multi-channel framer 106. Due to the fact that the multi-channel framer 106 is programmable to perform the trans-multiplexing function between many diverse pairs of channels, an advantage is provided in that the benefits of mass production may be employed to produce the trans-multiplexing data communications device 100 at lesser cost. Also, the operation of the trans-multiplexing data communications device 100 can be altered for multiple trans-multiplexing functions rather than requiring the purchase of a new device when parameters change for a given network application.

On one side, the multi-channel framer 106 may receive multiple DSx signals (n*DSxRx) and transmits the same multiple channels in the reverse direction (n*DSxTx). On the other side, the multi-channel framer 106 transmits data to a system side (SysRx) and receives data from the system side (n*SysTx). For example, the multi-channel framer 106 may receive multiple DS0, DS1, DS3 or other channels and may transmit data in the reverse direction on such channels. Also, the multi-channel framer 106 may transmit in other formats such as OC12 which is a sonnet frame format as can be appreciated.

Figure 2:
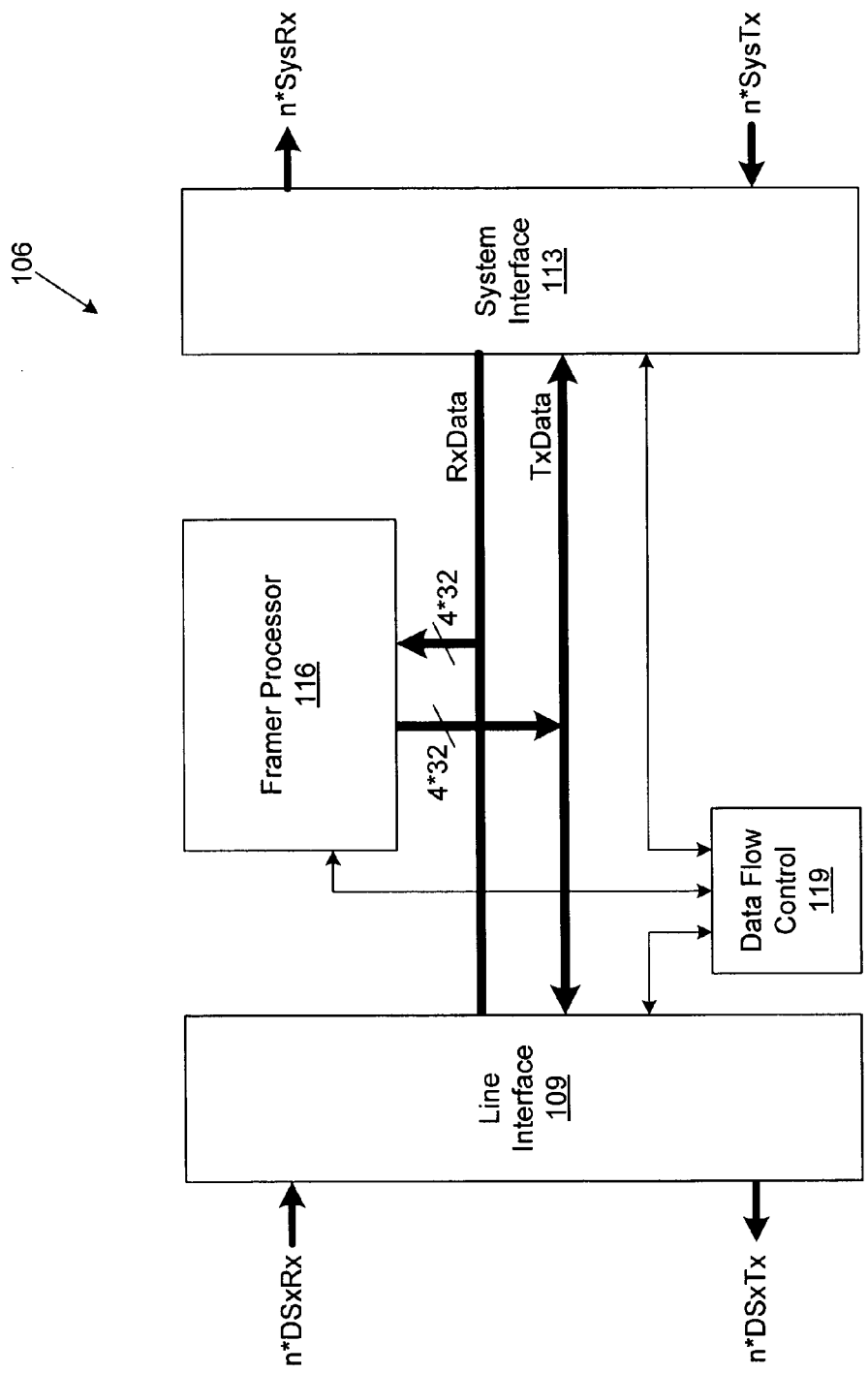
FIG. 2 is a schematic block diagram of one example of a multi-channel framer employed in the trans-multiplexing data communications device of FIG. 1 according to an embodiment of the present invention.

Turning then to FIG. 2, shown is a schematic block diagram of the multi-channel framer 106 according to an embodiment of the present invention. In this respect, the multi-channel framer 106 includes a line interface 109 and a system interface 113. Also, the multi-channel framer 106 includes a framer processor 116 and a data flow controller 119. The line interface 109, system interface 113, and framer processor 116 are each coupled to a receive data bus RxData and a transmit data bus TxData. Data that is received from either the line interface 109 or the system interface 113 is applied to the framer processor 116 by way of the receive data bus RxData. Data that is transmitted from the framer processor 116 to either the line interface 109 or the system interface 113 is transmitted by way of the transmit data bus TxData.

The data flow controller 119 configures the operation of the line interface 109, the system interface 113, and the framer processor 116 for general operation. In addition, the microcontroller 103 (FIG. 1) is also linked to the line interface 109, the system interface 113, the framer processor 116, and the data flow controller 119 to control the operation of the multi-channel framer 106.

The data received from each of the channels n*DSxRx is received in the line interface 109 in serial format. This data is written to memory banks in the framer processor 116 by way of the receive data bus RxData. When the serial data from each of the channels n*DSxRx is received in serial format, various buffering approaches are employed as appropriate so that such data may be read out in parallel format on the data bus RxData. Also, buffers are employed to serialize the data in the line interface 109 or the system interface 113 from the framer processor 116 on the transmit data bus TxData.

Data that is transmitted from either the line interface 109 or the system interface 113 to the framer processor 116, or data that is transmitted from the framer processor 116 to the line interface 109 or the system interface 113 may or may not employ all of the conductors of the receive and transmit data buses RxData and TxData. For example, for various data channels, it may be the case that 32 or 64 bits of each of the data buses RxData and TxData are employed, depending on the particular application for which the multi-channel framer 106 is employed. In this respect, the operation of the multi-channel framer 106 is configured by operation of the data flow controller 119 and the microcontroller 103 (FIG. 1).

Data that is transmitted from the line interface 109 or the system interface 113 to the framer processor 116 is written to various memory banks within the framer processor 116. In this respect, the data is placed in the memory banks or other memory structure of the framer processor 116 without regard for alignment of bit patterns/alignment bits of the data embodied therein with respect to the various bit/byte or memory segment boundaries of components within the memory structure of the framer processor 116 as will be described.

Figure 3:
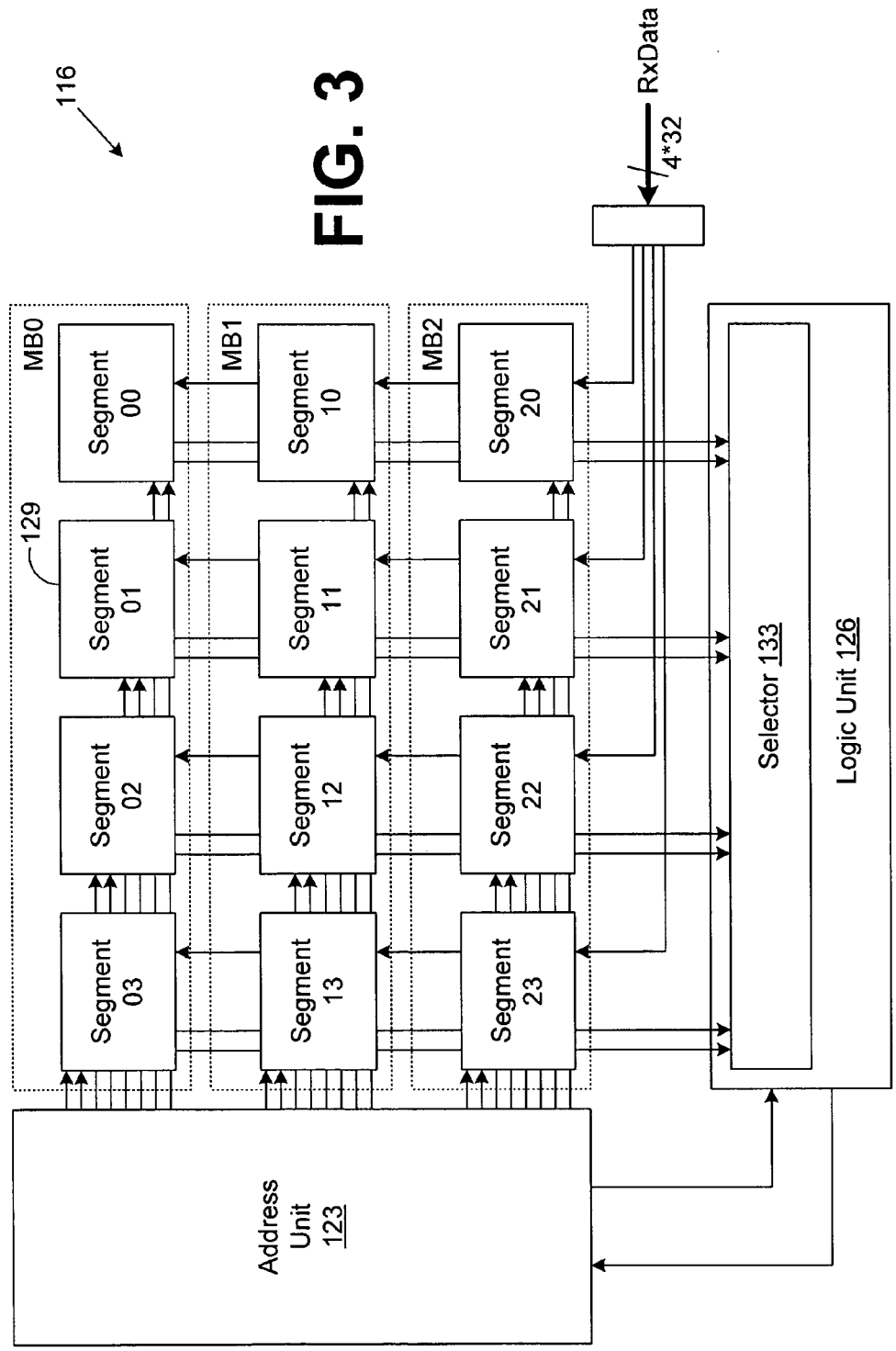
FIG. 3 is a schematic block diagram of one example of a portion of a framer processor employed in the multi-channel framer of FIG. 1 according to an embodiment of the present invention.

Turning then to FIG. 3, shown is a schematic block diagram of a portion of the framer processor 116 according to an embodiment of the present invention. The framer processor 116 includes an address unit 123 and a logic unit 126. In addition, the framer processor 116 includes a number of memory banks MB0, MB1, MB2, etc. Each of the memory banks MB0-N includes a number of memory segments 129. Each of the memory segments 129 is numbered in accordance with the memory bank within which it is located as well as the relationship with each other. For example, the memory segments 129 of memory bank MB0 are labeled 00, 01, 02, and 03, respectively, where the left most digit indicates the memory bank and the right most digit indicates the individual memory segment 129 within the memory bank MB0-N. Note, that while four memory segments 129 are shown within each memory bank MB0-N, it is possible that any number of memory segments 129 may be located within each of the memory banks MB0-N. Also, although three memory banks MB0-N are shown, it is possible that any number of memory banks MB0-N may be employed.

The logic unit 126 includes a selector 133 that is coupled to each of the memory segments 129 of the respective memory banks MB0-N. The framer processor 116 receives the data by way of the data bus RxData that is written to the various memory segments 129 of the memory banks MB0-N. The address unit 123 is manipulated to cause the data to be written into the various ones of the memory segments 129. The data is accessed from the memory banks 129 as data segments of a predefined length. For example, each data segment accessed for processing by the logic unit 126 may be accessed in 32 bit lengths, or other lengths. Each of the memory segments 129 is capable of holding a predefined data segment of specified length. For example, the memory segments 129 may be 32 bits long or some other length as can be appreciated.

Data is stored in the memory banks MB0-N I in data segments that have bit boundaries that are arbitrarily misaligned with the memory segment boundaries of the memory segments 129. In one embodiment, the memory segment boundaries may comprise, for example, the ends of the bit storage capacity of the memory segments 129 themselves. In this respect, the data received by the framer processor 116 is stored in the memory banks MB0-N without regard to whether bit boundaries of data segments of the data align with the memory segment boundaries of the memory segments 129. The selector 133 is employed to read desired ones of the data segments stored in the memory segments 129 even though the bit boundaries of the data segments are misaligned with the memory segment boundaries of the memory segments 129. The selector 133 facilitates reading data segments stored in the memory segments 129 that may overlap between two or more of the memory segments 129.

In this respect, the selector 133 facilitates the selection of data segments that have a bit boundary that is misaligned with the memory segments 129 by employing an addressing unit 123 that manipulates the selector 133 to extract or select the data segments stored in the memory segments 129 as will be described. Once a data segment has been obtained from various ones of the memory segments 129, then the data segment is applied to a data process in the logic unit 126 or other device. This process may be, for example, trans-multiplexing of data associated with various channels as discussed above. In selecting a data segment stored in the memory segments 129, the selector 133 may select a pair of the memory segments 129 from which data is to be obtained, where the data within both memory segments includes the entire data segment. Stated another way, the data segment my overlap two or more memory segments 129.

The selector 133 also includes circuitry that distinguishes the data segment from the entire amount of data read from the pair of data segments 129 selected. Each of the memory segments 129 may comprise a two port memory segment, for example, where the selector 133 selects a port of each of the memory segments 129 at a given time in order to access a respective data segment stored therein.

Figure 4:
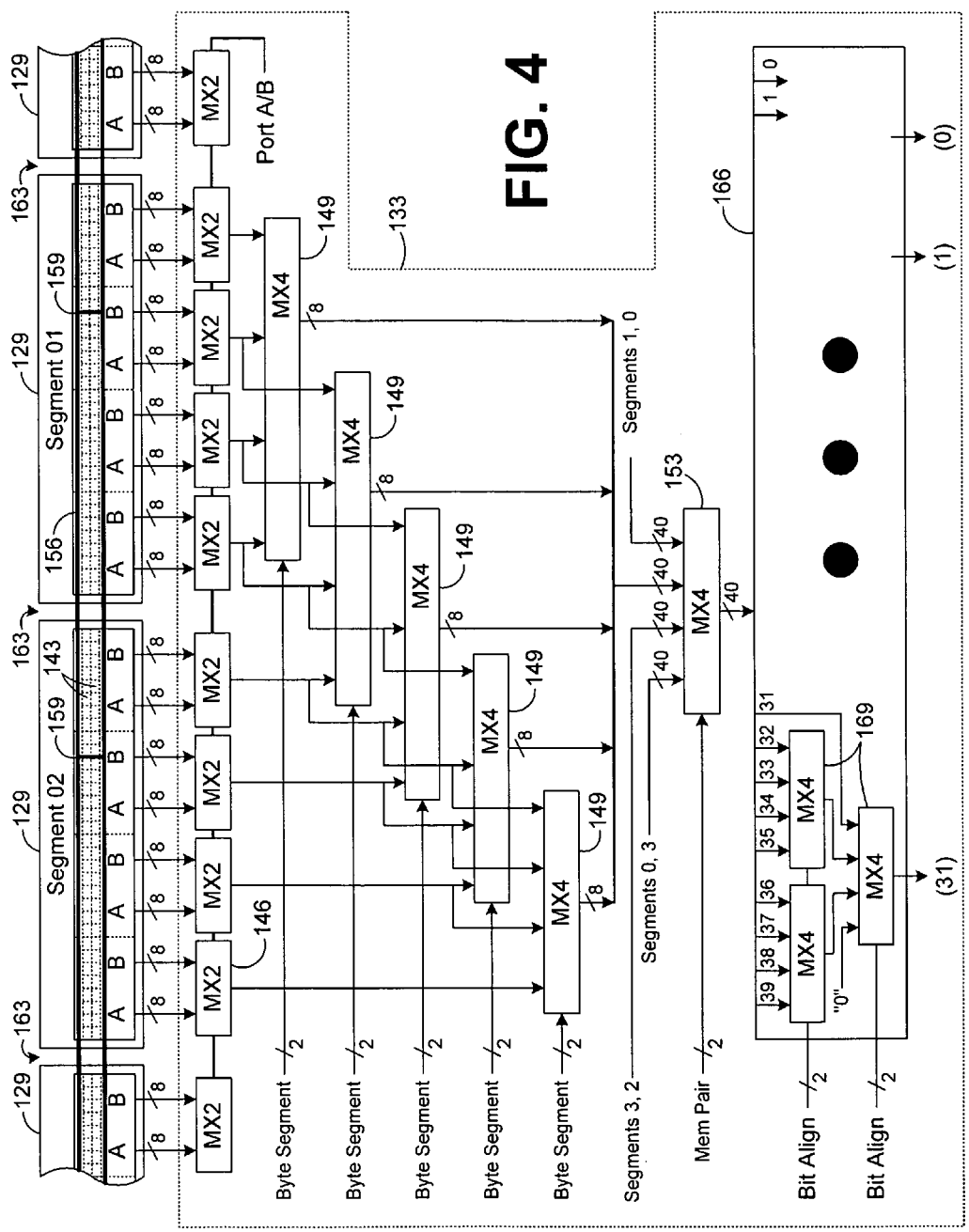
FIG. 4 is a schematic block diagram of one example of a selector employed in the framer processor of FIG. 2 according to an embodiment of the present invention.

Referring next to FIG. 4, shown is a schematic block diagram of one example of the selector 133 according to an embodiment of the present invention. The selector 133 is shown in conjunction with memory segments 129. Each of the memory segments 129 includes two ports through which two 32 bit data segments may be accessed, thereby allowing access to 64 total bits of data. However, it may be the case that the memory segments include more or less than 2 ports. Thus, each memory segment 129 may store, for example, four bytes 143 of data in each port.

Each byte 143 in the memory segments 129 may be read from the memory segments 129 by manipulating port selecting multiplexers 146. The selector 133 also includes byte selection multiplexers 149. While it is shown that the byte selection multiplexers are coupled to only two of the memory segments 129, it is understood, that the byte selection multiplexers 149 may be coupled to multiple memory segments 129 as is appropriate to access the data bytes 143 on each one of the memory segments 129 in the framer processor 116. The selector 133 also includes a memory pair multiplexer 153 according to an embodiment of the present invention. The memory pair multiplexer 153 selects a pair of the memory segments 129 of the addressed memory bank MB0-N within which the data segment is stored during a read operation. For example, the pairs of the memory segments 129 may comprise, for example, memory banks (3, 2), (2, 1), (1, 0), or (0, 3), etc.

In this respect, the bytes 143 selected by the byte selection multiplexers 149 from the respective pair of the memory segments 129 include the desired data segment 156 to be read from the respective memory banks 129. The data segment 156 is separated from other adjacent data segments at bit boundaries 159. The memory banks 129 are separated by memory bank boundaries 163.

The output of the memory pair multiplexer 153 is an integer number of bytes 143 from a respective pair of the memory segments 129. While the memory pair multiplexer 153 selects a pair of memory segments 129 in one embodiment of the invention, it may be possible that some other number of memory segments 129 may be selected such as would be the case, for example, if the desired data segment overlapped more than two memory segments 129. To accommodate the selection of numbers of memory segments 129 other than two, the number and size of the byte selection multiplexers 149 and other components of the selector 133 should be varied accordingly. The output of the memory pair multiplexer 153 is an initial data segment that is greater in length than the data segment 156 sought to be acquired or read from the respective memory segments 129. In this respect, the data segment is included within the initial data segment 156 that is output by the memory pair multiplexer 153.

The output of the memory pair multiplexer 153 is applied to an input to a bit alignment circuit 166. The bit alignment circuit 166 includes a repeated circuit of bit alignment multiplexers 169 as shown. The bit alignment multiplexers 169 in the bit alignment circuit 166 serve to isolate the desired data segment 156 from the data encompassed in the initial data segment output by the memory pair multiplexer 153. In this respect, a 32 bit segment, for example, included within an initial data segment that is 40 bits long is supplied to the output of the bit alignment circuit 166.

In one embodiment, the initial data segment is five bytes long. In this example, this is the minimum number of bytes 143 that are obtained from the respective pair of memory banks 129 that ensures that the entire data segment 156 is included therein, given that the desired data segment 156 spans across at least two memory segments 129. Also, the bytes 143 output by the memory pair multiplexer 153 are bit aligned with respect to the bytewise organization of the memory segments 129.

Next the general operation of the selector 133 is described. To begin, assume that a data segment 156 has been stored in a manner that it overlaps at least two of the memory segments 129. In this respect, the data segment 156 has bit boundaries 159 that are arbitrarily misaligned with at least one memory segment boundary 163 of the memory segments 129. The microcontroller 103 manipulates the address unit 123 to provide for various control inputs to each of the port selection multiplexers 146, the byte selection multiplexers 149, the memory pair multiplexer 153, and the bit alignment circuit 166 so as to isolate or select the data segment 156 from among a number of the memory bytes 143 within which the data segment 156 is located in the memory segments 129. The inputs to the port selection multiplexers 146 selects which of the memory ports are to be read out of the memory segments 129. The inputs to the byte selection multiplexers 149 are manipulated so as to select which ones of the bytes 143 of the memory segments 129 are to be supplied to the memory pair multiplexer 153.

The outputs of the port selection multiplexers 143 are applied as inputs to two or more of the byte selection multiplexers 149 as shown. The outputs of the byte selection multiplexers 149 applied as inputs to the memory pair multiplexers 153. A control input is applied to the memory pair multiplexer 153 to select a particular pair of the data segments 129 within which the data segment 156 is located. In this respect, the output of the memory pair multiplexer 153 comprises a number of the bytes 143 from the respective pair of memory segments 129 within which the data segment 156 is stored. In this respect, the byte selection multiplexers 149 and the memory pair multiplexer 153 select a subset of the total number of memory bytes 143 of the respective pair or other number of memory segments 129, where the data segment 156 is stored in the subset of the memory bytes 143.

In this sense, an initial data segment is ultimately selected and output from the memory pair multiplexer 153, where the initial data segment is greater in length than the data segment 156 included therein. This is done as the data stored in the memory segments 129 may be accessed, for example, in a bytewise manner. The output of the memory pair multiplexer 153 is applied to the bit alignment circuit 166 which serves to isolate the data segment 156 from the initial data segment that is greater in length than the data segment 156. The initial data segment comprises an integer number of the bytes 143 from the respective pair of the memory segments 129. By applying an appropriate control input to the bit alignment circuit 166 to control the bit alignment multiplexers 169, the data segment 156 is applied to the outputs of the bit alignment circuit 166. In this respect, the bit alignment circuit 166 selects the bits associated with the data segment 156 to be output for processing. In this manner, the data segment 156 is isolated from the initial data segment output by the memory pair multiplexer 153.

In addition, the logic embodied in the circuitry depicted in the schematic block diagram of FIG. 4 shows one implementation in terms of dedicated hardware. As an alternative embodiment, the same may be implemented as software or code executed by general purpose hardware as discussed above, or it may also be embodied in a combination of software/general purpose hardware and dedicated hardware. Also, where any portion of the logic embodied in the schematic block diagram of FIG. 4 comprises software or code, it can be embodied in any computer-readable medium for use by or in connection with an instruction execution system such as, for example, a processor in a computer system or other system. In this sense, the logic may comprise, for example, statements including instructions and declarations that can be fetched from the computer-readable medium and executed by the instruction execution system. In the context of the present invention, a "computer-readable medium" can be any medium that can contain, store, or maintain the logic for use by or in connection with the instruction execution system. The computer readable medium can comprise any one of many physical media such as, for example, electronic, magnetic, optical, electromagnetic, infrared, or semiconductor media. More specific examples of a suitable computer-readable medium would include, but are not limited to, magnetic tapes, magnetic floppy diskettes, magnetic hard drives, or compact discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

Although the invention is shown and described with respect to certain embodiments, it is obvious that equivalents and modifications will occur to others skilled in the art upon the reading and understanding of the specification. The present invention includes all such equivalents and modifications, and is limited only by the scope of the claims.

What is claimed is:

1. A memory access method, comprising the steps of:
   storing a data segment in a plurality of memory segments of at least one memory bank, wherein a data byte of the data segment has a bit boundary that is arbitrarily misaligned with at least one memory segment boundary of the plurality of memory segments; and selecting the data segment stored in the memory segments, wherein the selecting the data segment comprises:
  selecting a plurality of memory bytes stored in the memory segments, wherein the data segment is included in the memory bytes; and
  selecting a subset of bits comprising the data segment from the selected plurality of memory bytes.

2. The memory access method of claim 1, further comprising the step of applying the data segment to a data process.

3. The memory access method of claim 1, wherein the step of selecting the data segment stored in the memory segments further comprises the step of selecting a pair of the memory segments, wherein the data segment is stored in the pair of the memory segments.

4. The memory access method of claim 1, wherein each of the memory segments comprises a two port memory segment, and the step of selecting the data segment stored in the memory segments further comprises the step of selecting a port of the memory segments.

5. The memory access method of claim 1, wherein the step of selecting the data segment stored in the memory segments further comprises the step of selecting an initial data segment, the initial data segment including the selected plurality of memory bytes, the initial data segment being greater in length than the data segment, wherein the data segment is included in the initial data segment.

6. The memory access method of claim 5, further comprising the step of isolating the data segment from the initial data segment by selctively applying a plurality of bits of the initial data segment that embody the data segment to a parallel output port.

7. The memory access system of claim 1, wherein the memory bytes are aligned with the at least one memory segment boundary.

8. A memory access system, comprising:
  at least one memory bank having a plurality of memory segments; and
  a selector configured to select a data segment including a data byte stored in the memory segments, the data byte having a bit boundary that is arbitrarily misaligned with at least one memory segment of the memory segments, wherein the selector further comprises:
    circuitry that selects an initial data segment, the initial data segment being greater in length than the data segment, wherein the data segment is included in the initial data segment; and
    circuitry that isolates the data segment from the initial data segment.

9. The memory access system of claim 8, further comprising circuitry that applies the data segment to a data process.

10. The memory access system of claim 8, wherein the selector is further configured to select a pair of the memory segments, wherein the data segment is stored in the pair of the memory segments.

11. The memory access system of claim 8, wherein each of the memory segments comprises a two port memory segment, and the selector is further configured to select a port of the memory segments.

12. The memory access system of claim 8, wherein each of the memory segments comprises a plurality of memory bytes, and the selector is further configured to select a subset of the memory bytes, wherein the data segment is stored in the subset of memory bytes.

13. The memory access system of claim 8, wherein the circuitry that isolates the data segment from the initial data segment further comprises a bit alignment circuit that selectively applies a plurality of bits of the initial data segment that embody the data segment to a parallel output of the bit alignment circuit.

14. The memory access system of claim 8, wherein the circuitry that selects the initial data segment includes a plurality of multiplexers misaligned relative to a memory segment boundary.

15. The memory access system of claim 8, wherein the memory bytes are aligned with the at least one memory segment boundary.

16. A memory access system, comprising:
  at least one memory bank having a plurality of memory segments; and
  means for selecting a data segment stored in the memory segments, wherein a data byte of the data segment has a bit boundary that is arbitrarily misaligned with at least one memory segment boundary of the plurality of memory segments,
  wherein the means for selecting the data segment further comprises:
    a means for selecting a plurality of memory bytes stored in the memory segments, wherein the data segment is included in the plurality of memory bytes; and
    a means for selecting a subset of bits comprising the data segment from the selected plurality of memory bytes.

17. The memory access system of claim 16, wherein the means for selecting further comprises means for selecting a pair of the memory segments, wherein the data segment is stored in the pair of the memory segments.

18. The memory access system of claim 16, wherein each of the memory segments comprises a two port memory segment, and the means for selecting further comprises means for selecting a port of the memory segments.

19. The memory access system of claim 16, wherein each of the memory segments comprises a plurality of memory bytes, and the means for selecting further comprises means for selecting a subset of the memory bytes, wherein the data segment is stored in the subset of memory bytes.

20. The memory access system of claim 16, wherein the means for selecting further comprises means for selecting an initial data segment, the initial data segment including the selected plurality of memory bytes, the initial data segment being greater in length than the data segment, wherein the data segment is included in the initial data segment.

21. The memory access system of claim 16, wherein the memory bytes are aligned with the at least one memory segment boundary.

* * * * *